US008897008B2

(12) United States Patent
Terwilliger

(10) Patent No.: US 8,897,008 B2
(45) Date of Patent: Nov. 25, 2014

(54) INFORMATION HANDLING SYSTEM LOW PROFILE PLUGGABLE COOLING FAN AND CONNECTOR

(75) Inventor: Kevin Terwilliger, Austin, TX (US)

(73) Assignee: Dell Products L.P., Round Rock, TX (US)

( * ) Notice: Subject to any disclaimer, the term of this patent is extended or adjusted under 35 U.S.C. 154(b) by 224 days.

(21) Appl. No.: 13/561,203

(22) Filed: Jul. 30, 2012

(65) Prior Publication Data

US 2014/0029191 A1    Jan. 30, 2014

(51) Int. Cl.
| | | |
|---|---|---|
| *G06F 1/20* | (2006.01) | |
| *H05K 13/04* | (2006.01) | |
| *F04D 29/64* | (2006.01) | |
| *G06F 1/16* | (2006.01) | |

(52) U.S. Cl.
USPC ...... 361/688; 361/679.48; 361/695; 361/719; 165/80.2; 165/104.33; 415/213.1; 416/244 R

(58) Field of Classification Search
CPC ..... F04D 29/64; F04D 29/646; F04D 29/584; F04D 29/601; H05K 7/20; H05K 7/20172; H05K 7/20209; H05K 7/2019; H02H 7/04; H01F 41/00; F01D 25/28; G06F 1/16; G06F 1/20; G06F 1/206; Y02E 30/40; Y02E 60/12; H01G 7/022; B21D 53/88
USPC ......... 361/679.47–679.5, 690–697, 715–724; 165/80.2, 80.3, 104.33, 121–126, 185; 454/184; 415/188, 213.1, 220, 198 R; 416/120, 244 R, 204 R; 700/299, 300
See application file for complete search history.

(56) References Cited

U.S. PATENT DOCUMENTS

| | | | | |
|---|---|---|---|---|
| 5,102,040 | A | * | 4/1992 | Harvey .................... 236/49.3 |
| 5,249,741 | A | * | 10/1993 | Bistline et al. ............ 236/49.3 |
| 5,436,827 | A | * | 7/1995 | Gunn et al. .................. 700/82 |
| 5,562,410 | A | * | 10/1996 | Sachs et al. ............. 415/213.1 |
| 6,037,732 | A | * | 3/2000 | Alfano et al. ............... 318/471 |
| 6,247,898 | B1 | * | 6/2001 | Henderson et al. ........... 417/3 |
| 6,611,427 | B1 | * | 8/2003 | Liao ........................... 361/695 |
| 6,643,128 | B2 | * | 11/2003 | Chu et al. ............... 361/679.48 |
| 6,795,314 | B1 | * | 9/2004 | Arbogast et al. ............ 361/695 |
| 6,808,411 | B2 | * | 10/2004 | Chen .......................... 439/485 |
| 7,515,413 | B1 | * | 4/2009 | Curtis ......................... 361/695 |
| 7,522,415 | B2 | * | 4/2009 | Fan et al. .................... 361/695 |
| 7,525,800 | B1 | * | 4/2009 | Cheng ......................... 361/695 |
| 7,558,061 | B2 | * | 7/2009 | Franz et al. ................. 361/695 |
| 7,580,260 | B2 | * | 8/2009 | Figuerado ................... 361/695 |
| 7,583,043 | B2 | * | 9/2009 | Chung et al. ............... 318/634 |
| 7,612,508 | B2 | * | 11/2009 | Jreij et al. ................... 318/268 |
| 8,379,387 | B2 | * | 2/2013 | Chuang ....................... 361/695 |
| 8,705,235 | B2 | * | 4/2014 | Wang et al. ................. 361/695 |
| 2004/0190246 | A1 | * | 9/2004 | Arbogast et al. ............ 361/695 |
| 2008/0014093 | A1 | * | 1/2008 | Fan et al. ................ 416/244 R |
| 2008/0182501 | A1 | * | 7/2008 | Yang ............................ 454/184 |

* cited by examiner

*Primary Examiner* — Michail V Datskovskiy
(74) *Attorney, Agent, or Firm* — Terrile, Cannatti, Chambers & Holland, LLP; Robert W. Holland

(57) ABSTRACT

A connection arm couples to a cooling fan main body to enclose wires extending from the main body to an end of the connection arm that holds a plug of the wires in a position aligned with a circuit board cooling fan socket. Wires enclosed in the connection arm slip through a slot along the side of the connection arm and are protected from view by a cable cover disposed along the top surface of the cooling fan and connection arm.

16 Claims, 6 Drawing Sheets

INFORMATION HANDLING SYSTEM LOW PROFILE PLUGGABLE COOLING FAN AND CONNECTOR

BACKGROUND OF THE INVENTION

1. Field of the Invention

The present invention relates in general to the field of information handling system cooling fans, and more particularly to an information handling system low profile pluggable cooling fan and connector.

2. Description of the Related Art

As the value and use of information continues to increase, individuals and businesses seek additional ways to process and store information. One option available to users is information handling systems. An information handling system generally processes, compiles, stores, and/or communicates information or data for business, personal, or other purposes thereby allowing users to take advantage of the value of the information. Because technology and information handling needs and requirements vary between different users or applications, information handling systems may also vary regarding what information is handled, how the information is handled, how much information is processed, stored, or communicated, and how quickly and efficiently the information may be processed, stored, or communicated. The variations in information handling systems allow for information handling systems to be general or configured for a specific user or specific use such as financial transaction processing, airline reservations, enterprise data storage, or global communications. In addition, information handling systems may include a variety of hardware and software components that may be configured to process, store, and communicate information and may include one or more computer systems, data storage systems, and networking systems.

During normal operations, information handling systems generate heat as a byproduct of using electrical power. The primary source of heat is the central processing units (CPUs), however the many other components within an information handling system housing also generate heat, such as memory, chipsets, hard disk drives, etc. . . . Unless excess heat is removed from within the housing of the information handling system, components will fail as internal temperatures rise above operating constraints. In order to remove excess heat, information handling systems typically include one or more cooling fans that generate a cooling airflow through the housing.

Information handling systems sometimes share a housing or chassis. For example, often server information handling systems are aggregated into a large chassis or rack that shares power, cooling and communication resources. Rack enclosures often use standardized sizes, such as increments of a "rack unit" or "U", which measures the height allocated to an enclosure area within a rack that supports an information handling system. Larger server information handling systems can have a height of two or more U within a rack to contain physical components.

In order to ensure reliable operations of information handling systems within a rack, a typical rack will include multiple power and cooling resources for redundancy. Redundant power and cooling resources maintain information handling systems in an operational state in the event of a failure of a power or cooling resource, although operations on redundant resources during a failure may only have a degraded level.

Server information handling systems often support critical enterprise functions so that enterprises expect the ability for a rapid recovery from a degraded state of operations. One example of this is the hot-pluggable cooling fan, which allows a replacement cooling fan to plug into a motherboard socket while the information handling system is operating. The plug for the cooling fan is disposed on the bottom surface of the cooling fan and aligned to couple with the motherboard socket when the cooling fan is in place. In the event of a cooling fan failure, an end user pulls the entire cooling fan upwards from the motherboard and pushes a new cooling fan in its place to couple to the socket.

One difficulty with hot-pluggable cooling fans is that a 2U or greater height is typically needed for a server information handling system to accept a cooling fan with a plug disposed on the bottom surface that couples to a motherboard. In some instances, server information handling systems have a 1U height that does not offer adequate vertical space to place a plug on the motherboard. In typical 1U server information handling systems, cooling fans have a loose set of wires with a connector that an end user plugs into the motherboard behind the cooling fan location before the cooling fan is coupled in place. The loose wires sometimes cause confusion among end users since hot-pluggable fans typically expose a plug without exposing wires to indicate that the fan is hot-pluggable. In some instances, cooling fans for 1U servers include an arm that holds the plug in a position behind the fan body aligned with a motherboard socket so that the plug fits into the socket as the fan is put into place; however, exposed wires leading to the arm and into the socket can lead to confusion regarding whether the cooling fan is hot swappable or cold swappable.

SUMMARY OF THE INVENTION

Therefore a need has arisen for a system and method which supports pluggable cooling fans for use in information handling systems having restricted height.

In accordance with the present invention, a system and method are provided which substantially reduce the disadvantages and problems associated with previous methods and systems for pluggable cooling fans for use in information handling systems having restricted height. A connection arm extends from the cooling fan to a socket of a circuit board to enclose wires of the cooling fan and hide the wires from view.

More specifically, an information handling system processes information with a processor and memory coupled to a circuit board, such as a motherboard. The circuit board is installed in a chassis slightly raised over the chassis surface. One or more cooling fans couple to the chassis proximate to but not on top of the circuit board. The cooling fans have wires that extend to a plug, which is sized to fit in a cooling fan socket formed in the circuit board. A connection arm couples to the cooling fan and extends outward from the cooling fan to an end disposed over the circuit board. A slit formed in the connection arm accepts the wires and the end couples to the plug so that the connection arm encloses the wires within its interior to hide the wires from view by an end user looking down on the cooling fan. The plug is held by the end over the circuit board so that when the cooling fan couples to a mount of the chassis, the plug aligns with and couples to the cooling fan socket of the circuit board.

The present invention provides a number of important technical advantages. One example of an important technical advantage is that server information handling systems installed in racks with limited vertical height, such as 1U racks, have pluggable cooling fans that conform to usage models of information handling systems with greater height. An end user who removes a failed cooling fan or who observes a replacement cooling fan will see a contiguous unit that has a plug similar to other hot-pluggable cooling fans. A connector arm portion retains wires from sight in an aesthetically pleasing manner to reduce hazards associated with loose wires and to conform to conventional hot-pluggable usage models. In one embodiment, the connector arm portion removeably couples with the cooling fan and is provide with the information handling system motherboard so that a replacement cooling fan can re-use the connector arm portion.

BRIEF DESCRIPTION OF THE DRAWINGS

The present invention may be better understood, and its numerous objects, features and advantages made apparent to those skilled in the art by referencing the accompanying drawings. The use of the same reference number throughout the several figures designates a like or similar element.

DETAILED DESCRIPTION

Restricted height information handling systems are provided hot-pluggable cooling fans with a connection arm that extends from the cooling fan to a motherboard socket and encloses wires communicating between the socket and fan. For purposes of this disclosure, an information handling system may include any instrumentality or aggregate of instrumentalities operable to compute, classify, process, transmit, receive, retrieve, originate, switch, store, display, manifest, detect, record, reproduce, handle, or utilize any form of information, intelligence, or data for business, scientific, control, or other purposes. For example, an information handling system may be a personal computer, a network storage device, or any other suitable device and may vary in size, shape, performance, functionality, and price. The information handling system may include random access memory (RAM), one or more processing resources such as a central processing unit (CPU) or hardware or software control logic, ROM, and/or other types of nonvolatile memory. Additional components of the information handling system may include one or more disk drives, one or more network ports for communicating with external devices as well as various input and output (I/O) devices, such as a keyboard, a mouse, and a video display. The information handling system may also include one or more buses operable to transmit communications between the various hardware components.

Figure 1:
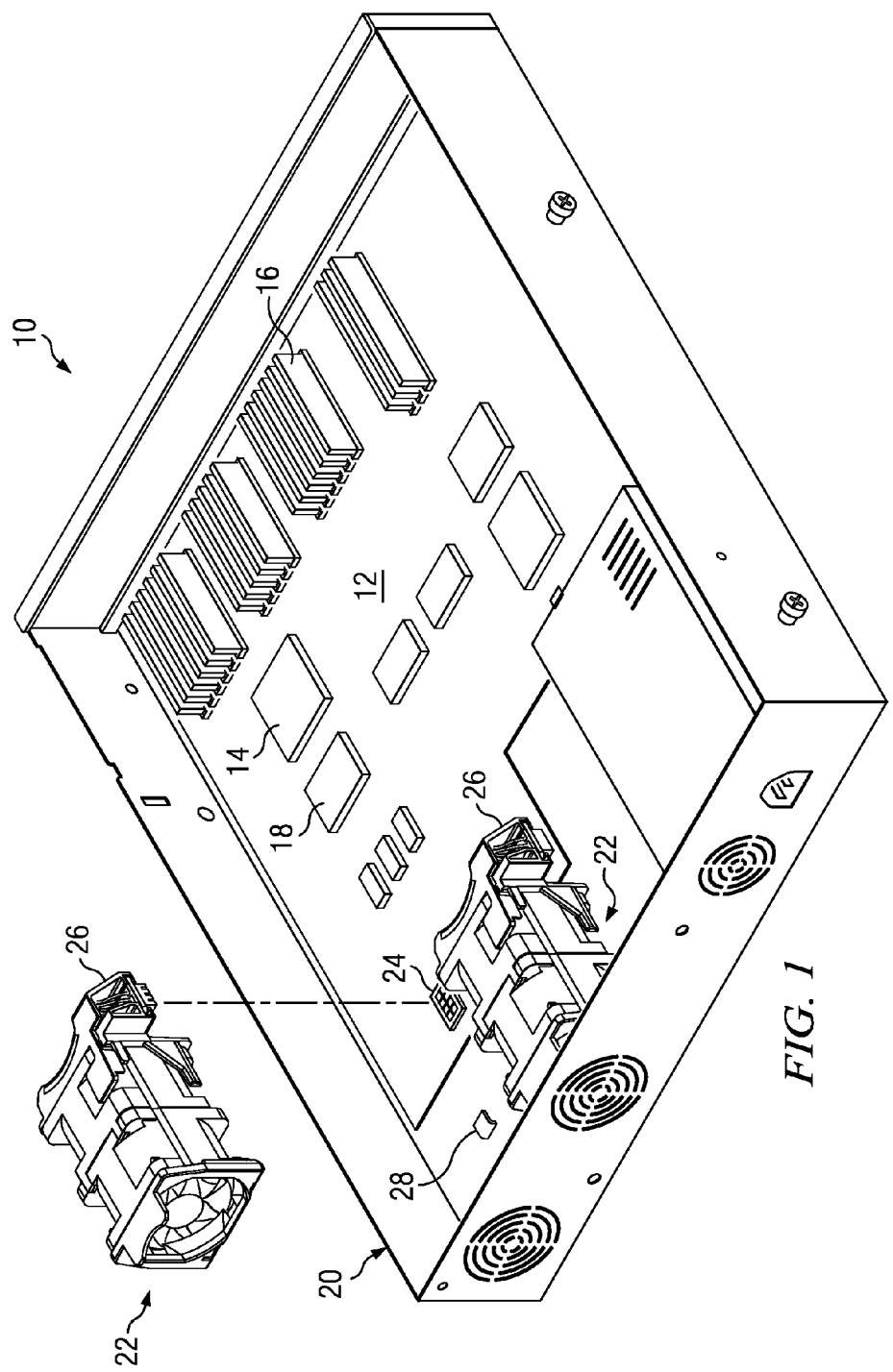
FIG. 1 depicts a side perspective view of an information handling system having hot-pluggable cooling fans.

Referring now to FIG. 1, a side perspective view depicts an information handling system 10 having hot-pluggable cooling fans 22. Information handling system 10 processes information with plural processing components interfaced through a motherboard 12. For example, a central processing unit (CPU) 14 executes instructions stored in memory 16, such as DRAM or flash memory, to perform processing functions. Wires built into motherboard 12 communicate signals between the processing components, such as wires integrated in a printed circuit board. A management controller 18 interfaces with motherboard 12 to perform management functions for information handling system 10. For example, management controller 18 is a baseboard management controller (BMC) that includes firmware instructions to execute for managing power consumption and thermal conditions at information handling system 10. In one example embodiment, information handling system 10 is a server supported in a chassis 20 that provides 1U of height.

Processing components of information handling system 10 generate excess heat as a by-product of using electrical power. To remove the excess heat from within chassis 20, one or more cooling fans 22 provide a cooling airflow over the processing components. Management controller 18 manages the operation of cooling fans 22 by communicating through motherboard 12 to a cooling fan socket 24 to which cooling fans 22 couple. For example, management controller 18 varies the speed at which cooling fan 22 runs based upon the thermal conditions within chassis 22. Cooling fans 22 couple to cooling fan socket 24 with a connector plug that extends out of a connection arm 26. Cooling fan 22 couples to chassis 20 at a cooling fan mount 28 that placed proximate to motherboard 12 but off to one side of motherboard 12. In the example embodiment depicted by FIG. 1, the 1U chassis does not have adequate height to allow cooling fan 22 to couple directly over top of motherboard 12; instead, cooling fan 22 couples to one side of motherboard 12 so that vertical space to hold cooling fan 22 is available. Connection arm 26 aligns the plug of cooling fan 22 over top of motherboard 12 so that the plug fits into cooling fan socket 24 as cooling fan 22 couples to cooling fan mount 28. If a cooling fan 22 fails during operation of information handling system 10, an end user replaces the failed cooling fan by pulling upwards and out to remove the failed cooling fan and then pushing a replacement cooling fan into cooling fan mount 28 to align the plug of connection arm 26 with cooling fan socket 24. In this manner, cooling fan 22 is hot-swappable, meaning that replacement can take place with information handling system 10 operating. Although the example embodiment depicted by FIG. 1 shows cooling fan socket 24 disposed in a motherboard 12, in alternative embodiments, other types of circuit boards may be used.

Figure 2:
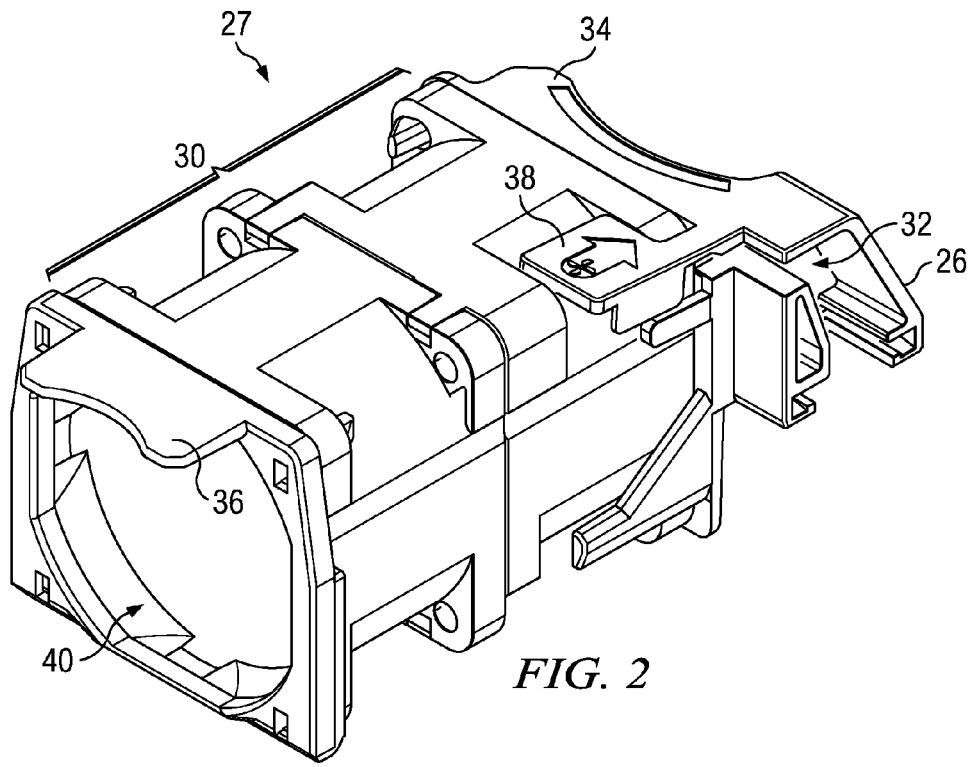
FIG. 2 depicts a side perspective view of a cooling fan with a connection arm to align a plug of cooling fan with a cooling fan socket of a motherboard.

Referring now to FIG. 2, a side perspective view depicts a cooling fan 22 with a connection arm 26 to align a plug of cooling fan 22 with a cooling fan socket 24 of a motherboard 12. A main body 30 of cooling fan 22 hold an electric motor, controller and fan blade that generate airflow from an intake 40 to an exhaust 42. In alternative embodiments, the airflow may travel in the opposite direction. Connection arm 26 couples to main body 30 at a rear portion to hold the plug at a raised height relative to the bottom surface of main body 30. Connection arm 26 forms a cable trough 32 that accepts wires from main body 30, encloses the wires within connection arm 26 and routes the wires to a plug at the bottom and end of connection arm 26. A rear finger pull 34 and front finger pull 36 provide leverage for an end user to pull upwards and remove cooling fan 22 from an installed location. A cable cover 38 is removeably coupled to connection arm 26 to cover the wires running through connection arm 26 and for selective removal by an end user to allow access to the wires. In one alternative embodiment, a cable cover may also be installed along the side of connection arm 26 to cover cable trough 32.

Figure 3:
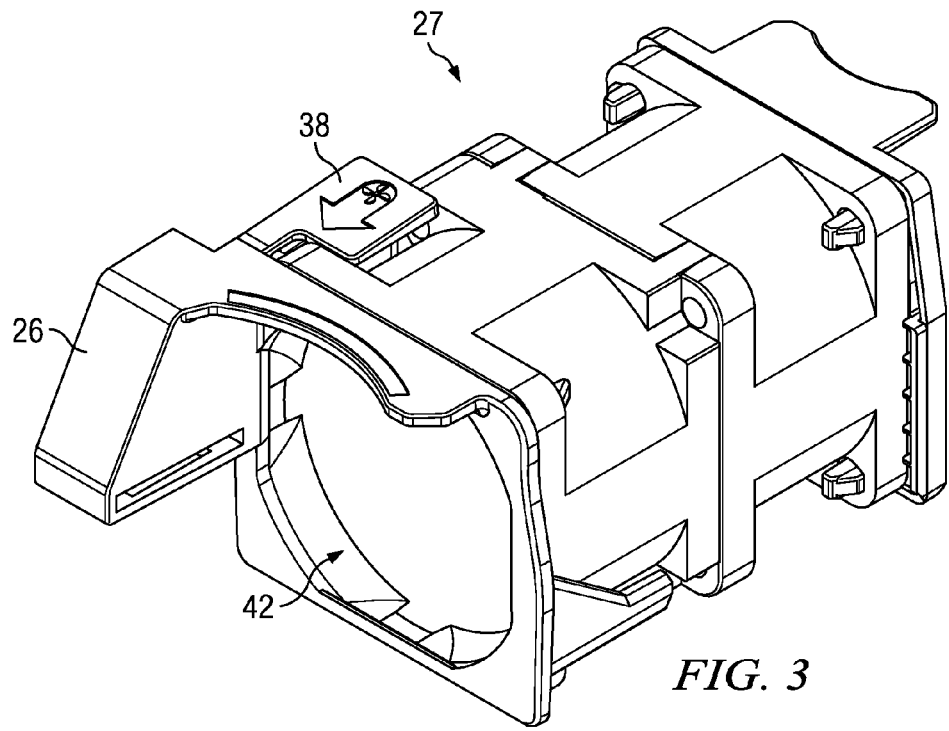
FIG. 3 depicts a rear perspective view of a cooling fan.
Figure 4:
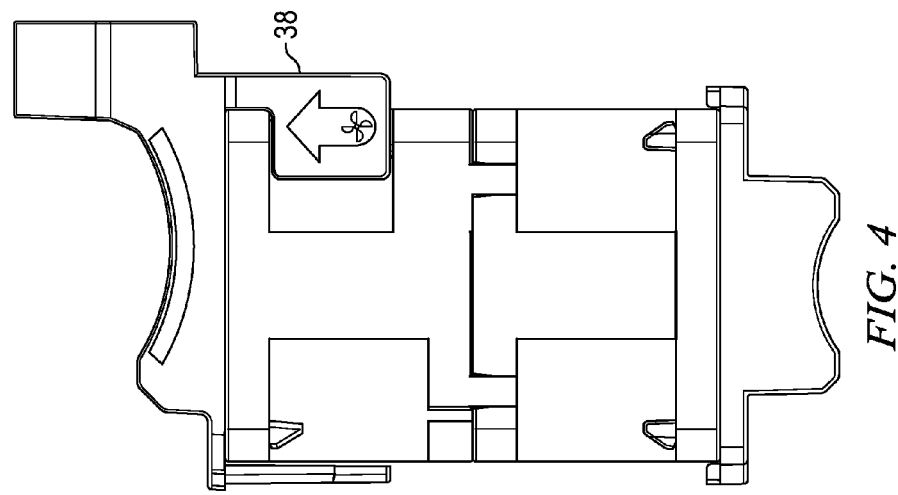
FIG. 4 depicts a top view of a cooling fan having a cable cover that hides wires of the cooling fan from view when the cooling fan is installed in an information handling system.

Referring now to FIG. 3, a rear perspective view depicts cooling fan 22. Connection arm 26 provides an aerodynamic surface at exhaust 42 and prevents exposure of fan control and power lines to the interior of fan 22. Rear finger pull 34 provides a surface to an end user to grasp within the narrow confines of a 1U chassis. By coupling cooling fan 22 to chassis 20 instead of the top surface of motherboard 12, cooling fan 22 has additional height available. Connection arm 26 extends outward and downward from the rear of cooling fan 22 so that the plug of cooling fan 22 is at the height of motherboard 12 when cooling fan 22 couples to chassis 20. FIG. 4 depicts a top view of cooling fan 22 and illustrates that cable cover 38 hides wires of cooling fan 22 from view when cooling fan 22 is installed in an information handling system 10. By hiding wires from view, cable cover 38 and connection arm 26 provide an appearance of a hot-swappable cooling fan that inserts directly into an information handling system.

Figure 5:
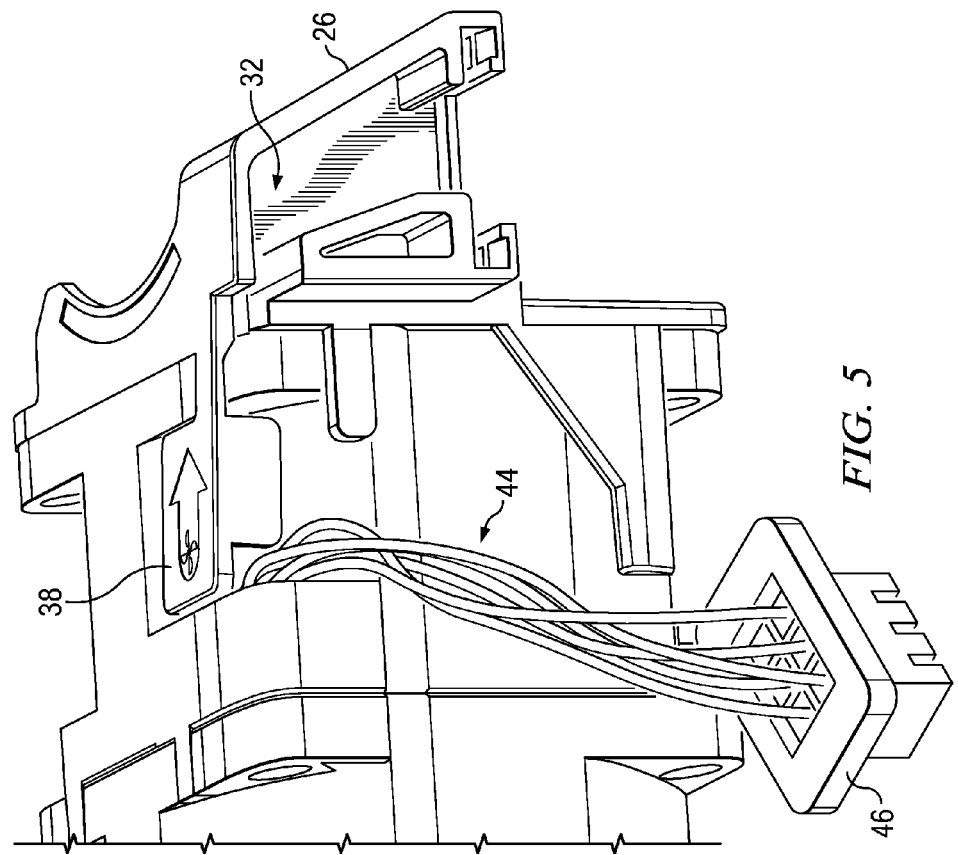
FIG. 5 depicts a side view of a cooling fan with a connection arm coupled to the rear of a main body and wires protruding with a plug at the end of wires.

Referring now to FIG. 5, a side view depicts a cooling fan 22 with connection arm 26 coupled to the rear of main body 30 and wires 44 protruding with a plug 46 at the end of wires 44. In the example embodiment, cooling fan 22 is a standardized size that fits in information handling systems having heights of 1U and greater. Connection arm 26 selectively couples to cooling fan 22 to adapt cooling fan 22 to use in a 1U chassis. Once connection arm 26 couples to the rear of cooling fan 22, wires 44 hang loose to allow plug 46 to extend to a cooling fan socket 24. Loose wires 44 present a hazard, even after the wires 44 are plugged into motherboard 12 since inadvertent damage may occur if the wires are hit by an end user or a moving device within information handling system 10.

Figure 6:
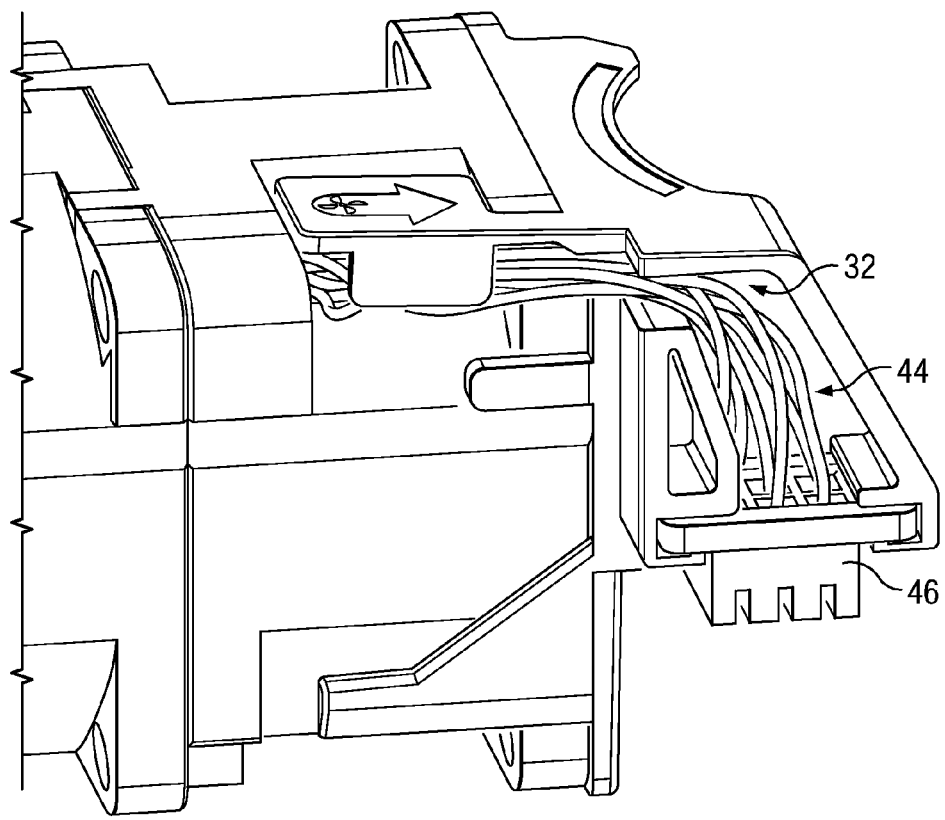
FIG. 6 depicts a side view of a cooling fan with a connection arm coupled to the rear of main body and wires enclosed within a cable trough.

Referring now to FIG. 6, a side view depicts a cooling fan 22 with connection arm 26 coupled to the rear of main body 30 and wires 44 enclosed within a cable trough 32. Plug 46 couples into the bottom end of connection arm 26 at a position that aligns with a motherboard 12 cooling fan socket 24 when cooling fan 22 couples of an information handling system 10 chassis 20. For example, connection arm 26 holds plug 46 at a height at which a circuit board will be held over a chassis 20 to which cooling fan 22 is coupled. In the example embodiment of FIG. 6, the height of plug 46 is approximately midway between the top and bottom of cooling fan 22. Cable trough 32 has a slit along its length so that wires 44 will slip into place. Cable trough 32 has a narrow opening so that wires 44 will not inadvertently slide out of the opening during installation and removal of cooling fan 22 at an information handling system 10. In one alternative embodiment, wires 44 may be completely enclosed by placing a cable cover over cable trough 32 after installation of wires 44.

Figure 7:
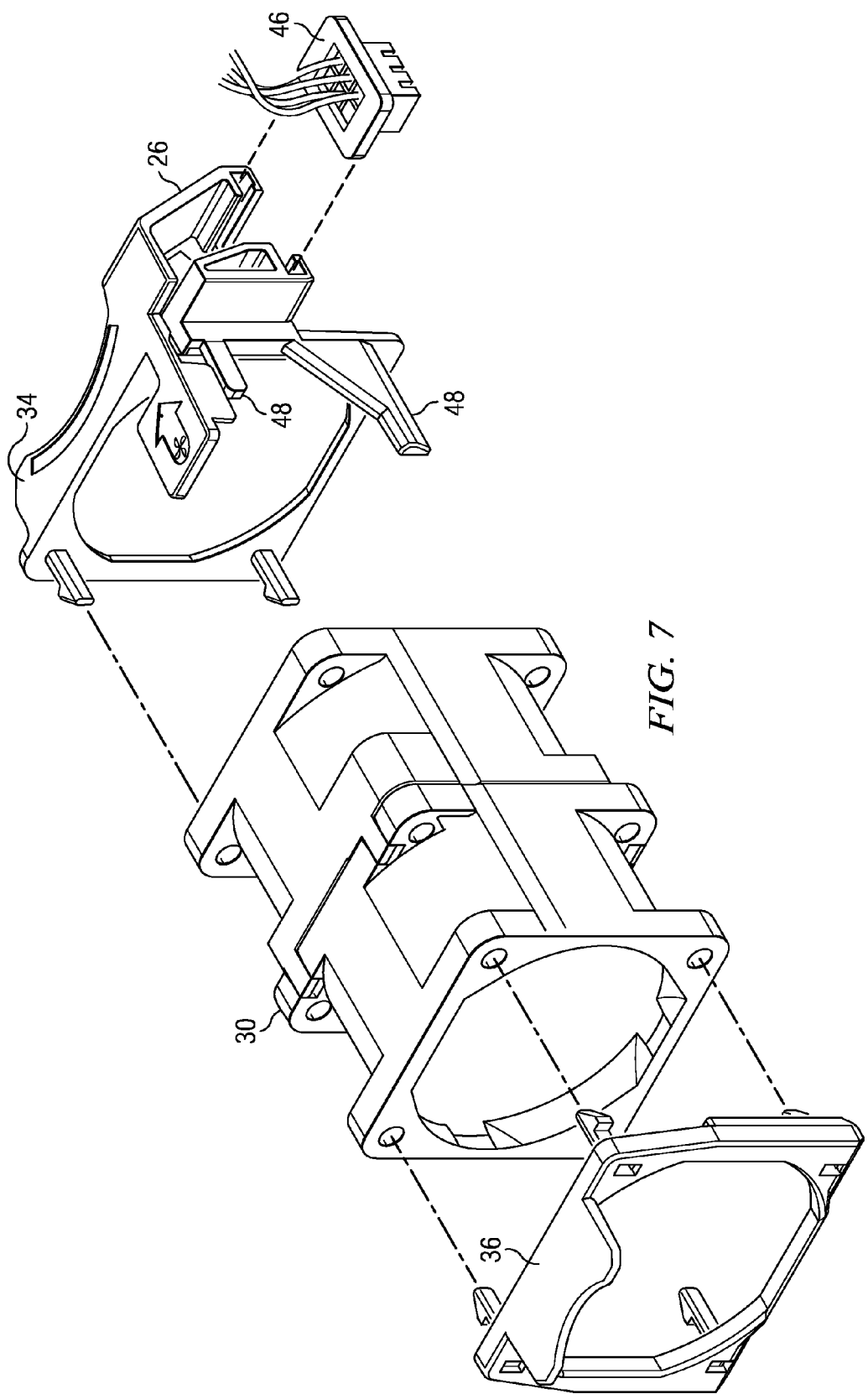
FIG. 7 depicts a blow-up view of a cooling fan with a connection arm separate from a main body.

Referring now to FIG. 7, a blow-up view depicts cooling fan 22 with a connection arm 26 separate from a main body 30. Snap connectors 48 of connection arm 26 engage main body 30 to selectively couple and decouple connection arm 26 with main body 30. In one embodiment, an information handling system that experiences a failure of cooling fan 22 has connection arm 26 selectively de-coupled from the failed cooling fan to allow coupling with a replacement cooling fan. By keeping the same connection arm 26 with the information handling system 10 or chassis 20, alignment of plug 46 with motherboard 12 is assured. In one alternative embodiment, connection arm 26 provides movement for the placement of plug 46 to aid in adapting cooling fans of different dimensions to an existing motherboard cooling fan socket. For example, sliding and rotating members within connection arm 26 allow selection of a location for aligning plug 46 to adjust to varying locations of a motherboard cooling fan socket relative to cooling fan 22.

Figure 8:
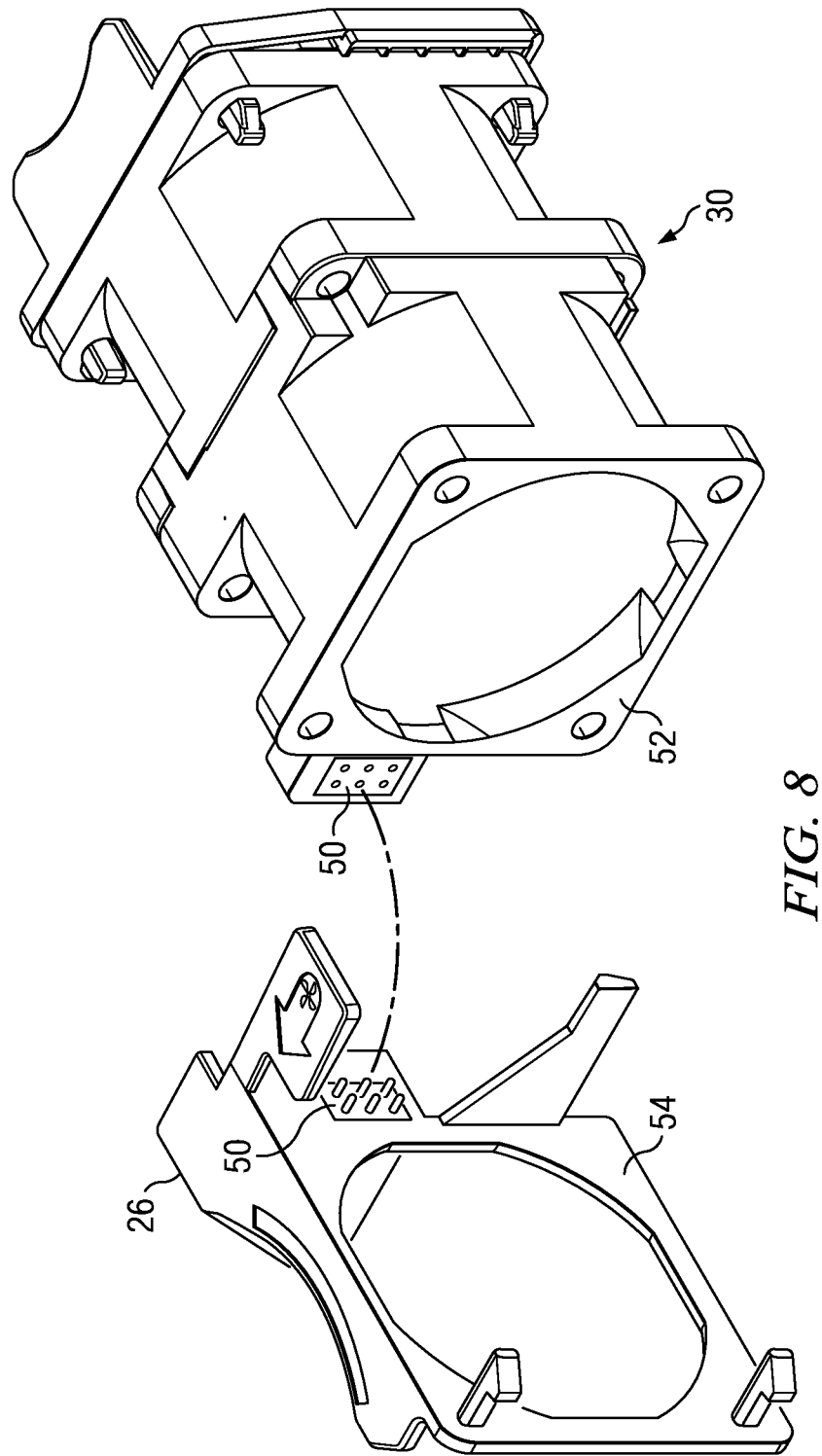
FIG. 8 depicts a blow-up view of a cooling fan with a separate connection arm having integrated wires.

Referring now to FIG. 8, a blow-up view depicts cooling fan 22 with a separate connection arm 26 having integrated wires. Opposing wire connectors 50 at main body rear 52 and connection arm front 54 couple to each other when connection arm 26 couples to main body 30. For example, opposing wire connectors 50 are a socket and plug that establish electrical communication between cooling fan 22 main body 30 and wires integrated within connection arm 26. By integrating wires 44 within connection arm 26, cooling fan 22 need only expose a wire connector without exposing loose wires. Upon failure at an information handling system, an end user lifts the failed cooling fan from chassis 20 with front finger pull 36 and/or rear finger pull 34 and de-couples connection arm 26 from main body 30. Opposing wire connectors 50 de-couple from each other as connection arm 26 separates from main body 30 so that no loose wires are exposed during removal of failed cooling fan 22. Connection arm 26 then couples to a replacement cooling fan 22 by snapping onto the main body rear 52 with the connection arm front 26 so that opposing connectors 50 interface main body 30 with wires integrated into connection arm 26. Once connection arm 26 couples to main body 30 the assembled cooling fan 22 inserts into a cooling fan mount 28 to align connector 46 at the end of connection arm 26 with a cooling fan socket 24 of motherboard 12.

Although the present invention has been described in detail, it should be understood that various changes, substitutions and alterations can be made hereto without departing from the spirit and scope of the invention as defined by the appended claims.

What is claimed is:

1. An information handling system comprising:
   a processor operable to process information;
   a memory operable to store the information;
   a circuit board coupled with the processor and the memory, the circuit board operable to communicate the information between the processor and memory;
   a management controller coupled to the circuit board;
   a cooling fan socket disposed in the circuit board and interfaced with the management controller, the management controller operable to control power to a cooling fan through the cooling fan socket; and
   a cooling fan proximate the circuit board and having a plug adapted to couple with the cooling fan socket, the cooling fan having a main body with a motor and a connection arm extending outward from the main body, the connection arm aligning the plug with the cooling fan socket and having a cable trough;
   wherein the connection arm comprises a removable portion that couples to the main body and decouples from the main body; and
   wherein the connection arm and main body comprise a coupling point that removeably interfaces wires enclosed in the cable trough to an electrical connector of the main body.

2. The information handling system of claim 1 further comprising a chassis supporting the circuit board and wherein the cooling fan couples to the chassis to one side of the circuit board and the connection arm aligns the plug from the cooling fan at the side of the chassis to a position over the circuit board cooling fan socket when the cooling fan couples to the chassis.

3. The information handling system of claim 2 wherein the cooling fan exposes an upper surface when coupled to the chassis and wherein the cable trough covers the wires from view at the upper surface.

4. The information handling system of claim 3 wherein the cable trough has an opening along a side surface, the opening sized pass the wires through for removing the wires from the cable trough.

5. The information handling system of claim 3 wherein the cable trough has a removable portion to provide access to the wires, the wires hidden from view when the removable portion is coupled to the cable trough.

6. The information handling system of claim 3 wherein the chassis provides not more than a 1U space for the circuit board.

7. The information handling system of claim 1 further comprising a finger pull extending from the connection arm to provide a surface for an end user to pull the cooling fan from the chassis.

8. A method for installing a cooling fan into an information handling system, the method comprising:
    coupling the cooling fan to a mount, the mount proximate to but separate from a circuit board, the circuit board having a socket sized to accept a plug of the cooling fan;
    aligning a plug of the cooling fan with the circuit board socket with a connection arm extending outwards from the cooling fan;
    integrating wires in a cable trough of the connection arm, the wires interfaced with the plug at a first end;
    exposing a connector at the connection arm, the wires interfaced with the connector at a second end;
    aligning the connector of the connection arm with a connector of the cooling fan; and
    coupling the connection arm to the cooling fan to bring the connection arm connector and the cooling fan connector into electrical communication.

9. The method of claim 8 further comprising communicating from the circuit board socket to the cooling fan with the wires enclosed in the cable trough.

10. The method of claim 8 wherein integrating wires further comprises pushing the wires into a slot formed in the connection arm along the cable trough and covering the slot with the wires in the cable trough.

11. The method of claim 8 wherein coupling the cooling fan to a mount further comprises coupling the cooling fan to a mount of a chassis at a height below the height of the circuit board and wherein aligning a plug of the cooling fan further comprises disposing the plug at an end of the connection arm with a height of the circuit board.

12. The method of claim 11 wherein aligning a plug of the cooling fan further comprises adjusting the position of the connection arm end relative to the cooling fan.

13. A cooling fan comprising:
    a main body operable to generate an airflow;
    one or more wires interfacing the main body with a plug, the plug accepting commands for controlling the airflow; and
    a connection arm extending outwards from the main body and having an end that aligns with a socket;
    wherein the main body and connection arm are removeably coupled with each other and the one or more wires are integrated in a cable trough of the connection arm, the cooling fan further comprising opposing connectors disposed on the main body and connection arm, the opposing connectors providing electrical communication between the main body and the one or more wires when the connection arm couples to the main body.

14. The cooling fan of claim 13 further comprising a cable cover coupled to the connection arm to hide the wires from view in a predetermined direction.

15. The cooling fan of claim 13 wherein the connection arm aligns the end at a height between a top and bottom height of the main body.

16. The cooling fan of claim 13 wherein the connection arm further has a slot along the length of the cable trough sized to accept the wires.

* * * * *